United States Patent
Hwang et al.

(10) Patent No.: US 7,799,490 B2
(45) Date of Patent: Sep. 21, 2010

(54) OPTICAL MASKS AND METHODS FOR MEASURING ABERRATION OF A BEAM

(75) Inventors: Chan Hwang, Seoul (KR); Suk-Joo Lee, Gyeonggi-do (KR); Han-Ku Cho, Gyeonggi-do (KR); Sang-Gyun Woo, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 12/686,093

(22) Filed: Jan. 12, 2010

(65) Prior Publication Data

US 2010/0112466 A1    May 6, 2010

Related U.S. Application Data

(62) Division of application No. 11/311,109, filed on Dec. 19, 2005, now Pat. No. 7,670,725.

(30) Foreign Application Priority Data

Dec. 21, 2004    (KR) ............... 10-2004-0109830

(51) Int. Cl.
*G03F 1/00*    (2006.01)
(52) U.S. Cl. .................. 430/5; 250/492.3; 430/311
(58) Field of Classification Search .............. 250/492.3; 430/5, 311; 716/19, 21
See application file for complete search history.

(56) References Cited

U.S. PATENT DOCUMENTS 6,869,739 B1    3/2005    Ausschnitt et al.

FOREIGN PATENT DOCUMENTS

| JP | 2001-091214 | 4/2001 |
| JP | 2003-289029 | 10/2003 |
| KR | 1998-0083834 | 12/1998 |
| KR | 2003-0089342 | 11/2003 |

OTHER PUBLICATIONS

English Translation of JP 2001-091214, Apr. 2001, Sato et al.
English Translation of JP 2003-289029, Oct. 2003, Komoriya et al.
Korean Office Notice to File a Response/Amendment to the Examination Report No. 9-5-2006-023910108 Date Apr. 26, 2006.
English Translation of Korean Office Notice to File a Response/Amendment to the Examination Report No. 9-5-2006-023910108 Date Apr. 26, 2006.

*Primary Examiner*—Mark F Huff
*Assistant Examiner*—Rashid Alam
(74) *Attorney, Agent, or Firm*—Myers Bigel Sibley & Sajovec, PA

(57) ABSTRACT

An optical mask for use with an exposure beam includes a mask substrate adapted to be placed on a traveling path of the exposure beam. A reference pattern is formed on the mask substrate. The reference pattern is adapted to direct the exposure beam to travel in a predetermined reference direction. A comparative pattern is formed on the mask substrate. The comparative pattern is adapted to direct the exposure beam to travel in a direction inclined at a predetermined angle with respect to the reference direction.

11 Claims, 12 Drawing Sheets

$W_{a1} = W_{a2}$ $W_{ax1} = W_{ay1} = W_{ax2} = W_{ay2}$ $W_{b1} \neq W_{b2}$ $W_{bx1} = W_{by1} \neq W_{bx2} = W_{by2}$ $W_{c1} = W_{c2}$
$W_{c1} \neq W_{cp}$ $W_{cx1} = W_{cy1}$    $W_{cx2} \neq W_{cy2}$

OPTICAL MASKS AND METHODS FOR MEASURING ABERRATION OF A BEAM

CROSS-REFERENCE TO RELATED APPLICATIONS

The present application is a divisional of and claims priority from U.S. patent application Ser. No. 11/311,109, filed Dec. 19, 2005, now U.S. Pat. No. 7,670,725 which claims the benefit of Korean Patent Application No. 2004-109830, filed on Dec. 21, 2004, the disclosures of which are hereby incorporated by reference herein in their entireties.

FIELD OF THE INVENTION

The present invention relates to methods for measuring optical characteristics and optical devices using the same and, more particularly, to optical masks and methods for measuring an aberration of a beam.

BACKGROUND OF THE INVENTION

Because optical characteristics, such as refraction, diffraction, reflection, polarization and interference, can be described in physics, optical technologies are widely used in various industrial fields. Specifically, a short-wavelength beam can be useful in an industrial field that requires high resolution, such as an exposure process for a semiconductor device. The rapid growth of the semiconductor industry (especially, the manufacture of highly integrated semiconductor devices) in the past decades is a typical example where optical technologies have been applied successfully.

In order to obtain higher resolution, however, a technology that can control light characteristics more precisely may be required. For example, in the case of an exposure process for a semiconductor device, optical characteristics, such as exposure beam intensity, focal length and telecentricity, should be controlled precisely. However, such optical characteristics are influenced by inherent errors in optical/mechanical components constituting the optical system. Because the optical/mechanical components of the optical system may be deformed due to temperature change, gravity, acceleration or abrasion from movement, the enhancement of precision is restricted even though the understanding of beam characteristics is sufficient. Accordingly, a new technology that can enhance the precision is desirable.

In order to overcome the optical precision restrictions, various technologies have been proposed. An exposure system that requires high resolution may demand a strict control of telecentricity. Telecentricity is an optical characteristic associated with change in image magnification or shape distortion. FIGS. 1A and 1B are views for explaining an optical system having a perfect telecentricity. FIGS. 2A, 2B, 3A and 3B are views for explaining optical systems having two types of non-telecentricity.

Referring to FIGS. 1A and 1B, beams 10a are vertically incident on a reference plane 5 in parallel to one another. In this case, images formed by the beams 10a have identical shape and size without regard to positions of the reference plane (that is, $W_{a1}=W_{a2}$, $W_{ax1}=W_{ay1}=W_{ax2}=W_{ay2}$). By contrast, as illustrated in FIGS. 2A and 2B, when beams 10b are not in parallel, the beams 10b are incident on a reference plane 5 at various angles. In this case, when the position of the reference plane 5 is changed, an image may be increased or decreased in size (that is, $W_{b1} \neq W_{b2}$, $W_{bx1}=W_{by1}$, $W_{bx2}=W_{by2}$, $W_{by1} \neq W_{by2}$). In the case of such a non-telecentricity, the magnification may be changed depending on the change in focal length. However, because recent exposure systems can precisely control the focal length, a type of non-telecentricity as illustrated in FIGS. 3A and 3B is experienced more often than that illustrated by FIGS. 2A and 2B.

Referring to FIG. 3A, although beams 10c are in parallel to one another, the beams 10c are deviated from a predetermined reference direction and are incident on a reference plane 5 at an angle thereto. In this case, as illustrated in FIG. 3B, an image may change from a circular shape to an elliptical shape (that is, $W_{c1}=W_{c2}$, $W_{cl} \neq W_{cp}$, $W_{cx1}=W_{cy1}$). $W_{cx2}=W_{cy2}$).

In addition, resolution of a lithography process can be expressed as Equation 1 below $$\text{resolution} = k_1 \frac{\lambda}{NA} \quad \text{(Equation 1)}$$

From Equation 1, the resolution of the lithography process is proportional to a process constant $k_1$ and a wavelength $\lambda$, and is inversely proportional to a numerical aperture (NA). Accordingly, reduction of the process constant is required to enhance the resolution. However, because recent exposure systems perform an exposure process using even an edge of a lens so as to reduce the process constant $k_1$, exposure beams used in the exposure process may be deviated from the lens when the exposure systems have non-telecentricity as illustrated in FIG. 3A.

Accordingly, there is a demand for a technology that can precisely measure the non-telecentricity (aberration of beam) illustrated in FIG. 3A. The measurement of the non-telecentricity can be achieved by measuring a deformation of an illumination formed on a defocused image plane, or by transferring an alignment key or overlay key of a photo mask on a wafer and measuring the transferred image.

With reference to FIG. 4, in a method for measuring deformation of illumination, the degree of the deformation can be difficult to quantify due to the influence from illumination components 22, such as a fly-eye lens, a cylinder lens, a mirror and a condensing lens, which are arranged between a light source 21 and a reticle 23. For example, since a boundary of an image formed on an image plane 25 becomes obscured due to the influence of the illumination components 22, it may be difficult to objectively quantify the degree of the deformation.

FIG. 5 is a flowchart illustrating a method of measuring the transferred image of an alignment key or overlay key. Referring to FIG. 5, in Step 31, a reference pattern is formed using a reference key under a best focus condition. In Step 32, a comparative pattern is formed using a comparative key under a defocus condition. In Step 33, an aberration of an exposure beam is determined by measuring a gap between the reference pattern and the comparative pattern.

At this point, in order to measure the gap, the reference pattern and the comparative pattern must be able to be discriminated with respect to one another. Also, in order to discriminate, the reference key and the comparative key should have different shapes and must be spaced apart from each other a measurable distance. In order to meet those conditions, the wafer is moved such that the comparative pattern is formed in a vicinity of the reference pattern. However, the optical precision provided by an exposure system having high resolution is within an error level of the precision in the movement of the wafer. Therefore, a satisfactory measurement of the resulting aberration cannot be obtained using the method including the step of moving the wafer.

SUMMARY OF THE INVENTION

According to embodiments of the present invention, an optical mask for use with an exposure beam includes a mask substrate adapted to be placed on a traveling path of the exposure beam. A reference pattern is formed on the mask substrate. The reference pattern is adapted to direct the exposure beam to travel in a predetermined reference direction. A comparative pattern is formed on the mask substrate. The comparative pattern is adapted to direct the exposure beam to travel in a direction inclined at a predetermined angle with respect to the reference direction.

According to further embodiments of the present invention, an optical mask for use with an exposure beam includes a mask substrate adapted to be placed on a traveling path of the exposure beam. First and second reference patterns are formed on the mask substrate. The first and second reference patterns are being adapted to direct the exposure beam to travel in a predetermined reference direction. First and second comparative patterns are formed on the mask substrate and spaced apart from the first and second reference patterns, respectively. The first and second comparative patterns have a symmetrical configuration centered about the first and second reference patterns, respectively, such that first and second comparative beams of the exposure beam passing through the first and second comparative patterns, respectively, have symmetrical traveling paths with respect to the reference direction.

According to further embodiments of the present invention, a method for measuring an aberration of a beam using an exposure system that employs a prescribed exposure beam and an optical mask including a reference pattern and a comparative pattern comprises: projecting the optical mask on an image plane using the exposure beam such that a reference image and a comparative image corresponding to the reference pattern and the comparative pattern, respectively, are imaged on the image plane; measuring a distance between the reference image and the comparative image; and determining an aberration angle of the exposure beam using the distance measurement. The reference pattern is configured differently from the comparative pattern such that a reference beam of the exposure beam passing through the reference pattern is directed in a different direction than the comparative beam of the exposure beam passing through the comparative pattern.

According to further embodiments of the present invention, a method for measuring an aberration of a beam using an exposure system that employs a prescribed exposure beam and an optical mask including a reference pattern and first and second comparative patterns arranged on either side of the reference pattern comprises: projecting the optical mask on an image plane using the exposure beam such that a reference image, a first comparative image and a second comparative image corresponding to the reference pattern, the first comparative pattern, and the second comparative pattern, respectively, are imaged on the image plane; measuring a distance between the reference image and the first comparative image and a distance between the reference image and the second comparative image; and determining an aberration angle of the exposure beam using the distance measurements. The reference pattern is configured differently than the first and second comparative patterns such that a reference beam of the exposure beam passing through the reference pattern is directed in a different direction than comparative beams of the exposure beam passing through the first and second comparative patterns.

According to further embodiments of the present invention, a method for measuring an aberration of a beam using an exposure system and an optical mask including first and second reference patterns and first and second comparative patterns, wherein the exposure system includes a light source for generating a predetermined exposure beam and a lens system for focusing the exposure beam on a predetermined focal plane, comprises: projecting the optical mask on an image plane using the exposure beam such that first and second reference images and first and second comparative images corresponding to the first and second reference patterns and the first and second comparative patterns are imaged on the image plane; measuring a distance between the first reference image and the first comparative image and a distance between the second reference image and the second comparative image; and determining an aberration angle of the exposure beam using the distance measurements. The step of projecting the optical mask on the image plane is performed under a defocused condition wherein the image plane is in a defocused position spaced apart from the focal plane by a predetermined defocus length. The first and second reference patterns and the first and second comparative patterns are configured such that exposure beams passing through the first and second reference patterns travel in a direction parallel to each other, and exposure beams passing through the first and second comparative patterns travel in a direction different from each other.

Further features, advantages and details of the present invention will be appreciated by those of ordinary skill in the art from a reading of the figures and the detailed description of the preferred embodiments that follow, such description being merely illustrative of the present invention.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF EMBODIMENTS OF THE INVENTION

Figure 1A:
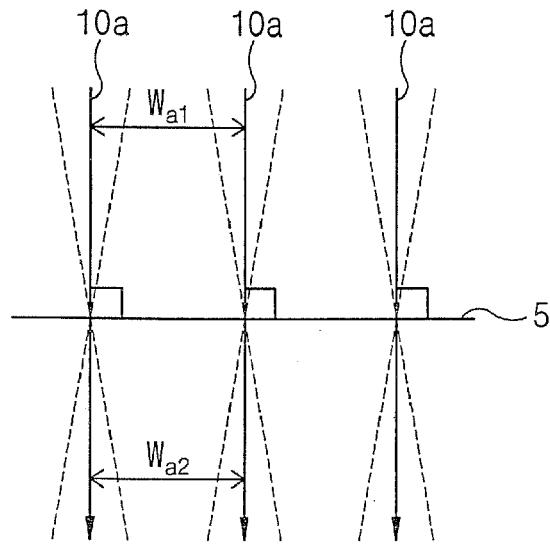
FIGS. 1A and 1B are schematic views for explaining an optical system having perfect telecentricity.
Figure 1B:
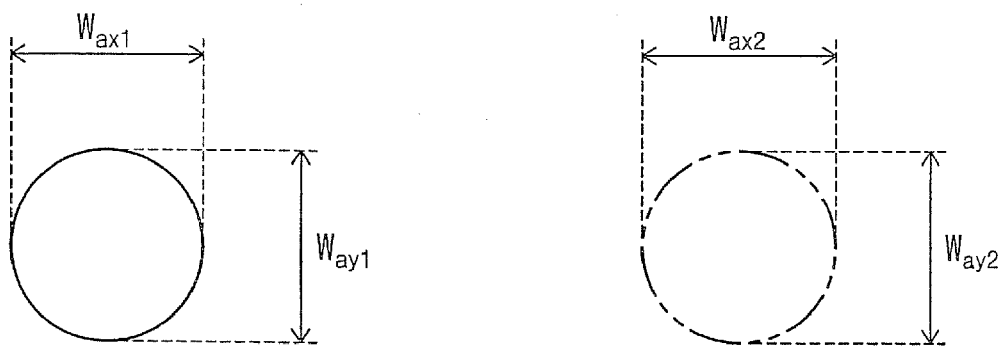
Figure 2A:
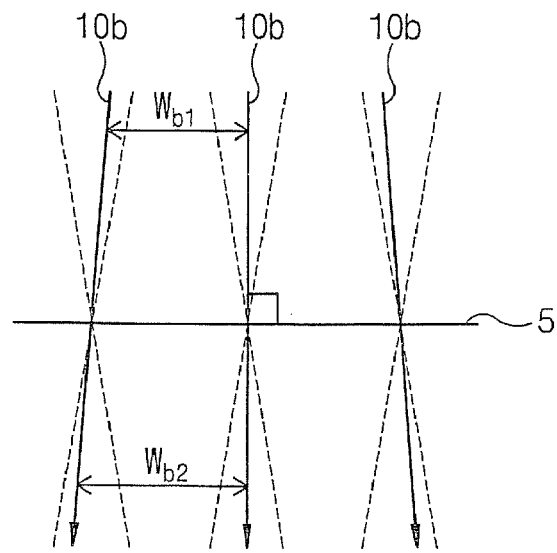
FIGS. 2A and 2B are schematic views for explaining an optical system having a first type of non-telecentricity.
Figure 2B:
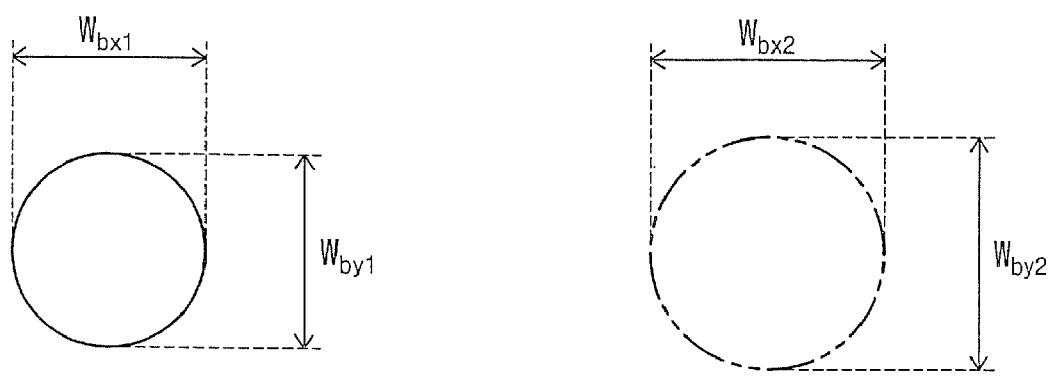
Figure 3A:
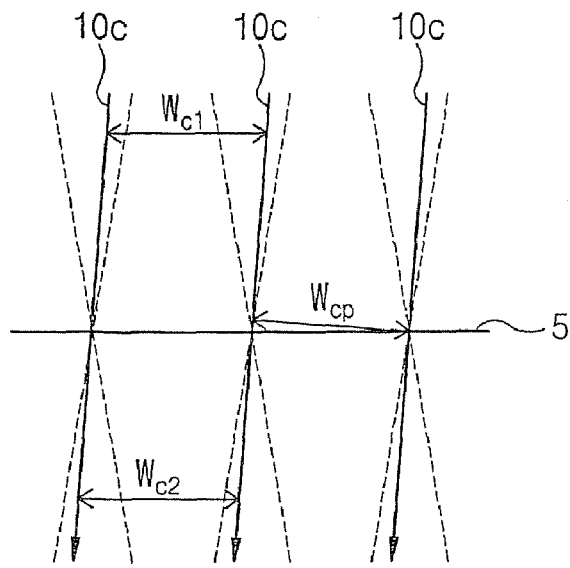
FIGS. 3A and 3B are schematic views for explaining an optical system having a second type of non-telecentricity.
Figure 3B:
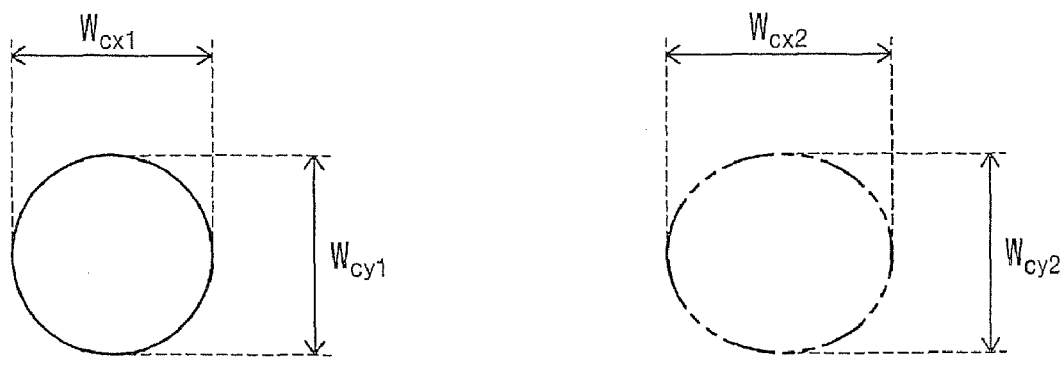
Figure 4:
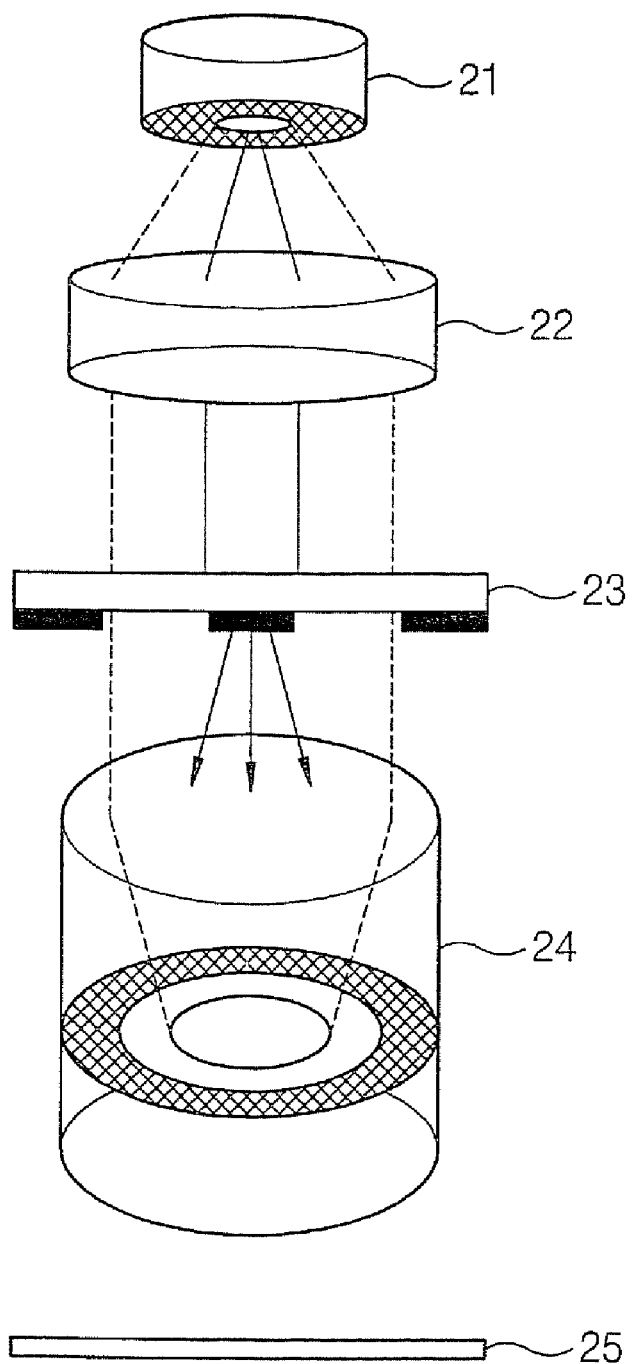
FIG. 4 is a schematic view of a prior art exposure system.
Figure 5:
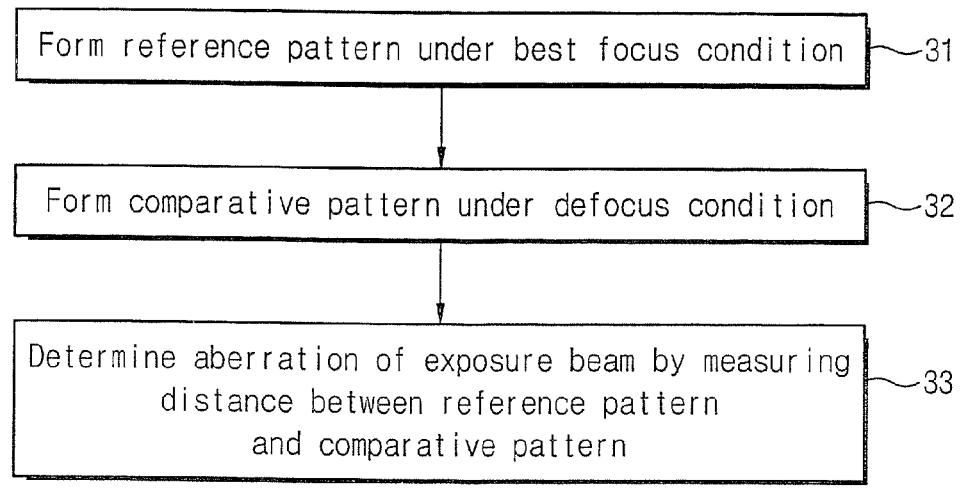
FIG. 5 is a flowchart illustrating a method according to the prior art for measuring an aberration of a beam.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout. As used herein the term "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 6:
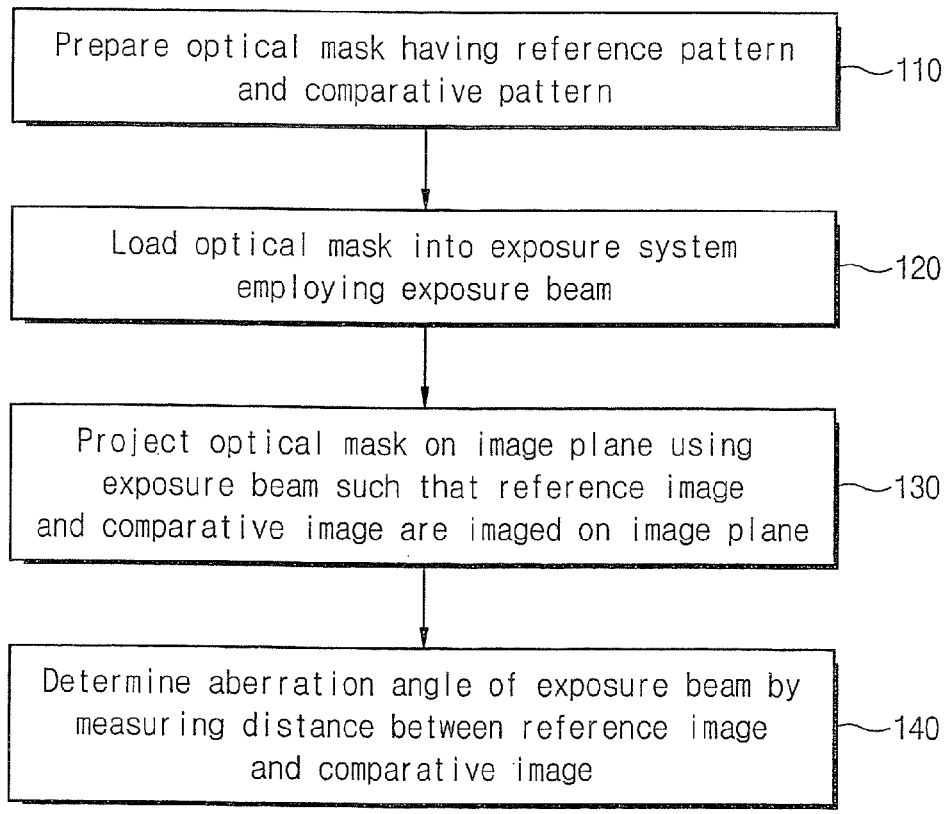
FIG. 6 is a flowchart illustrating a method according to embodiments of the present invention for measuring an aberration of a beam.

FIG. 6 is a flowchart illustrating methods according to embodiments of the present invention for measuring an aberration of a beam. An optical mask having at least one reference pattern and at least one comparative pattern is prepared (Step 110). The optical mask is loaded in an exposure system that uses a predetermined exposure beam (Step 120). A reference image and a comparative image corresponding to the reference pattern and the comparative pattern are formed on an image plane by projecting the optical mask on the image plane using the exposure beam (Step 130).

According to some embodiments, the optical mask is a photo mask (i.e., a reticle). The reference pattern and the comparative pattern are paired. That is, each reference pattern is paired with a corresponding comparative pattern. Multiple comparative patterns may be paired with each reference pattern as discussed below with reference to FIGS. 7 and 10. Further, like the embodiment illustrated in FIG. 10, multiple reference patterns may be used.

According to embodiments of the present invention, the reference pattern and the comparative pattern are formed such that a reference beam and a comparative beam passing through the reference pattern and the comparative pattern travel in different directions. The "reference beam" and the "comparative beam" as referred to herein mean the paths through which optical phases formed by the reference pattern and the comparative pattern are propagated. For example, in the case where the reference pattern is a shading pattern, there is no beam passing through the reference pattern. However, there is an optical phase difference between a beam passing through a region where the shading pattern is formed and a beam passing through a region where the shading pattern is not formed. This phase difference can be used to form a pattern by transferring the beams onto the photoresist. For this reason, when the shading pattern is used, it can be understood that "the reference beam" and "the comparative beam" mean the propagating processes of the optical phases. Hereinafter, the reference beam and the comparative beam will be used to include the foregoing meaning.

The reference pattern(s) may be a binary phase pattern and the comparative patterns may be a multi-phase pattern. For example, the reference pattern(s) may be or include at least one pattern selected from the group consisting of a shading pattern, a chrome pattern, an attenuated pattern, and a phase shift pattern. The comparative patterns may be or include at least one pattern selected from the group consisting of a prismatic pattern, an echelon pattern, an echelon grating, and a transmission grating.

FIGS. 7 to 10 are perspective views of optical masks according to first to fourth embodiments of the present invention. FIGS. 11A to 11C are views for explaining optical effects that can be obtained through optical masks according to embodiments of the present invention.

Figure 7:
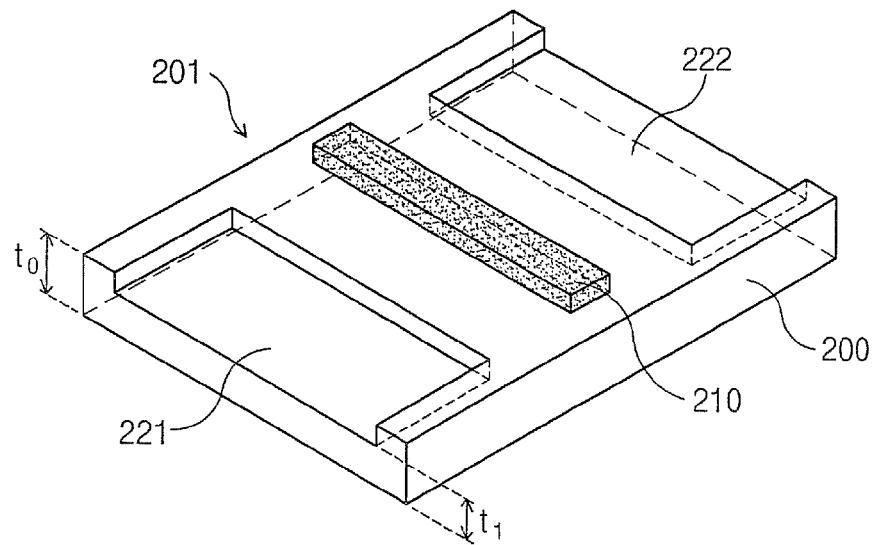
FIG. 7 is a perspective view of an optical mask according to embodiments of the present invention.
Figure 8:
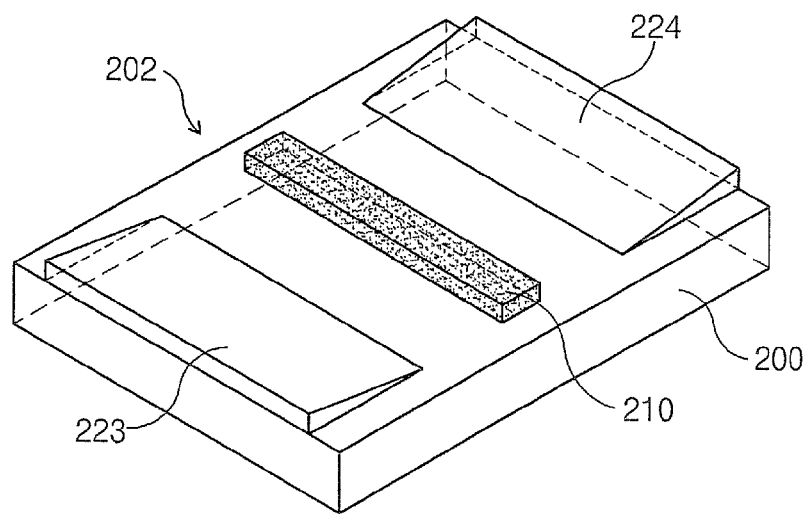
FIG. 8 is a perspective view of an optical mask according to further embodiments of the present invention.
Figure 9:
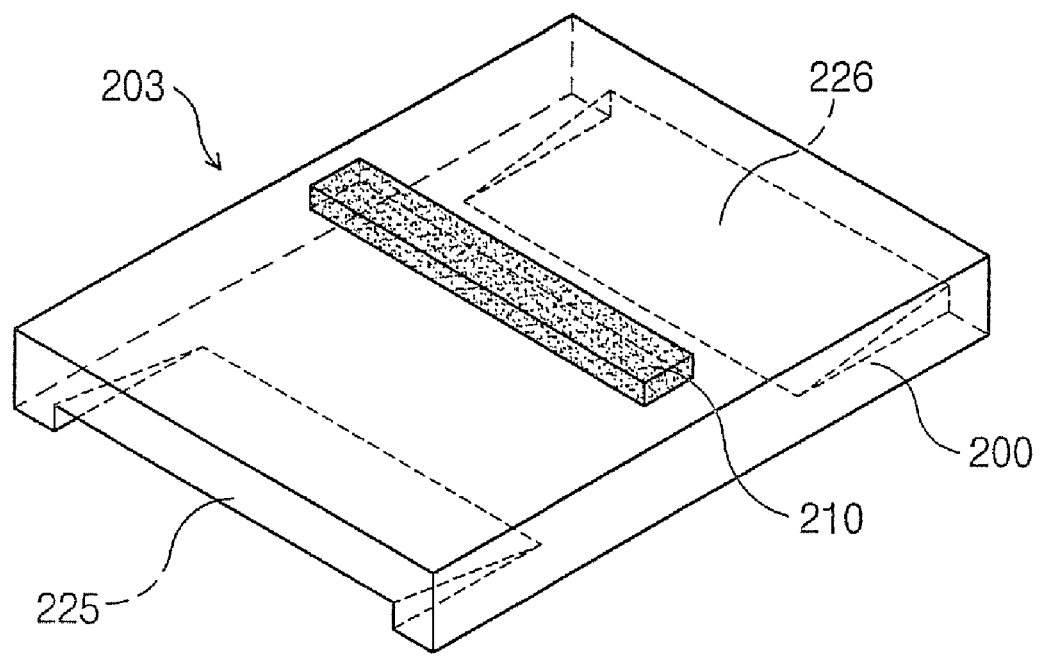
FIG. 9 is a perspective view of an optical mask according to further embodiments of the present invention.

Referring to FIGS. 7 and 11A, an optical mask according to first embodiments of the present invention includes a reference pattern 210 located at a predetermined portion of a mask substrate 200, and a first comparative pattern 221 and a second comparative pattern 222 located on either side of the reference pattern 210.

Referring to FIG. 11A, in use an exposure beam 255 is passed through the optical mask 201. The exposure beam 255 includes a reference beam 250, a first comparative beam 251 and a second comparative beam 252. The first comparative beam 251 and the second comparative beam 252 pass through the first comparative pattern 221 and the second comparative pattern 222 such that the first and second beams 251, 252 have symmetrical traveling paths with respect to the reference beam 250. For this purpose, the first and second comparative patterns 221 and 222 are spaced apart from the reference pattern 210 by the same distance and are respectively located on either side (i.e., opposed sides) of the reference pattern 210. It is preferable that the first and second comparative patterns 221 and 222 be symmetric about the reference pattern 210.

Figure 12:
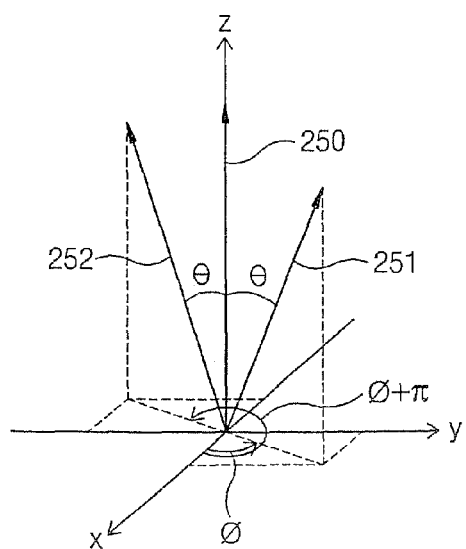
FIG. 12 is a view for explaining an angle between a reference beam and a comparative beam according to embodiments of the present invention.

Further, the traveling paths of the first and second comparative beams 251 and 252 diverge from the reference beam 250. That is, for the exposure beam 255 that is vertically incident on the mask substrate 200, the first comparative beam 251 travels in a direction defined by a zenith angle of θ and an azimuthal angle of φ with respect to the reference beam 250, and the second comparative beam 252 travels in a direction defined by a zenith angle of θ and an azimuthal angle of φ+π (as shown in FIG. 12).

According to some embodiments, the reference pattern 210 is a chrome pattern, and the first and second comparative patterns 221 and 222 are echelon patterns formed to have a different thickness from the mask substrate 200 (i.e., $t_0 \neq t_1$). This thickness difference between the mask substrate 200 and the comparative patterns 221 and 222 refracts the beam paths passing through the comparative patterns 221 and 222.

Referring to FIGS. 8 and 11B and FIGS. 9 and 11C, the optical masks 202 (FIG. 8) and 203 (FIG. 9) according to the second and third embodiments of the present invention have structures similar to the optical mask 201 according to the first embodiment, except for the configurations of the first comparative patterns 223 and 225 and of second comparative patterns 224 and 226 for refracting traveling directions of the first and second comparative beams 251 and 252. In the embodiments of FIGS. 11B and 11C, the first comparative patterns 223 and 225 and the second comparative patterns 224 and 226 are prismatic patterns that can refract an incident exposure beam in a prescribed or predetermined direction.

In addition, as in the first embodiment, the first comparative patterns 223 and 225 and the second comparative patterns 224 and 226 are symmetrically formed such that the first comparative beam 251 and the second comparative beam 252 travel symmetrically with respect to the reference beam 250. That is, due to the first comparative patterns 223 and 225 and the second comparative patterns 224 and 226, the first comparative beam 251 travels in a direction defined by a zenith angle of θ and an azimuthal angle of φ with respect to the reference beam 250, and the second comparative beam 252 travels in a direction defined by a zenith angle of θ and an azimuthal angle of φ+π (as shown in FIG. 12).

According to modified embodiments of the present invention, the first comparative pattern 221 and the second comparative pattern 222 (FIG. 8) may be formed with an echelon grating and a transmission grating, and a prism may be further attached thereto.

Figure 10:
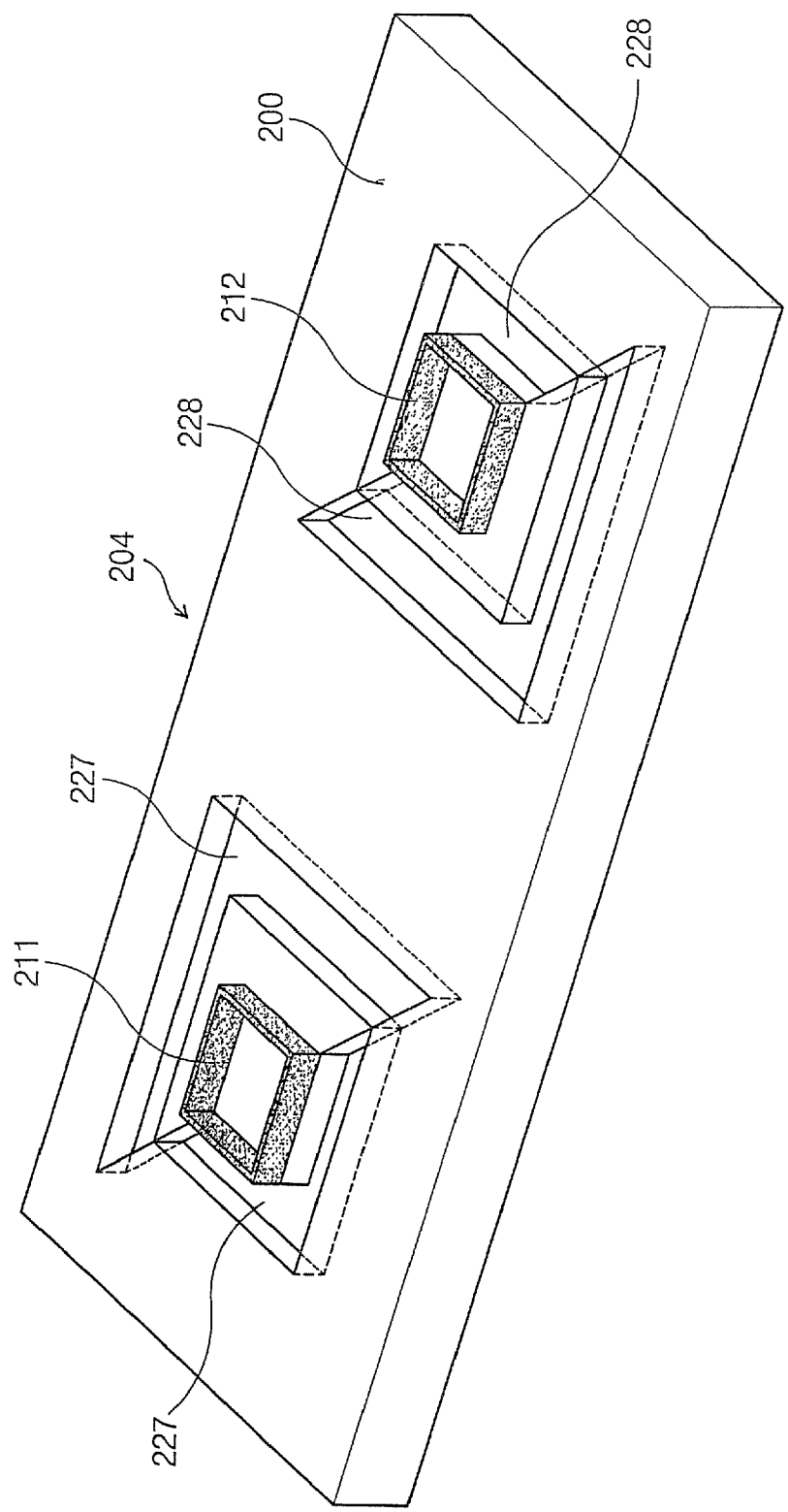
FIG. 10 is a perspective view of an optical mask according to further embodiments of the present invention.
Figure 11A:
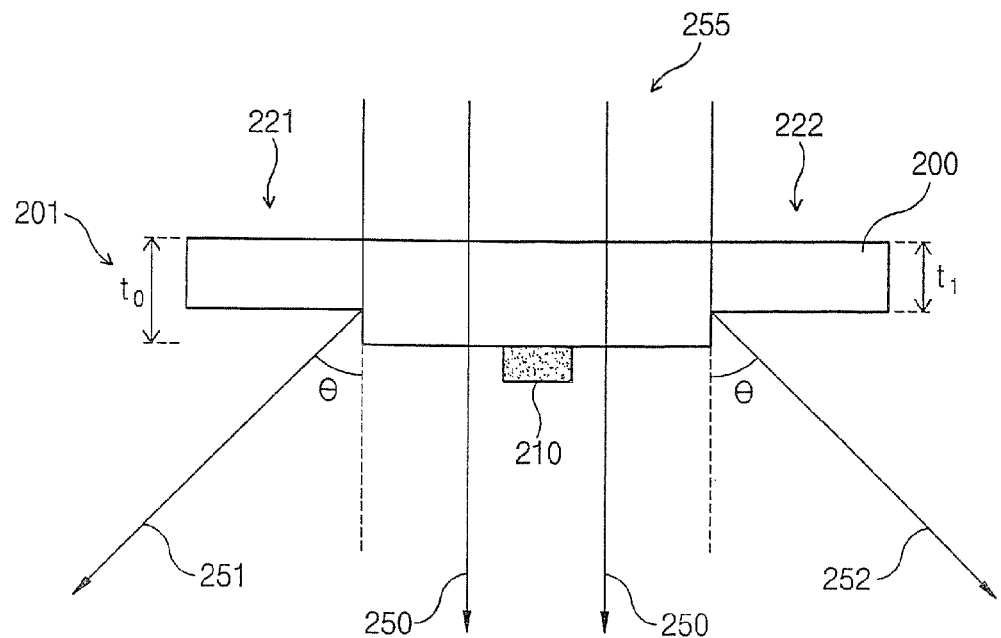
FIGS. 11A to 11C are schematic side views for explaining optical effects that can be obtained using optical masks according to embodiments of the present invention.
Figure 11B:
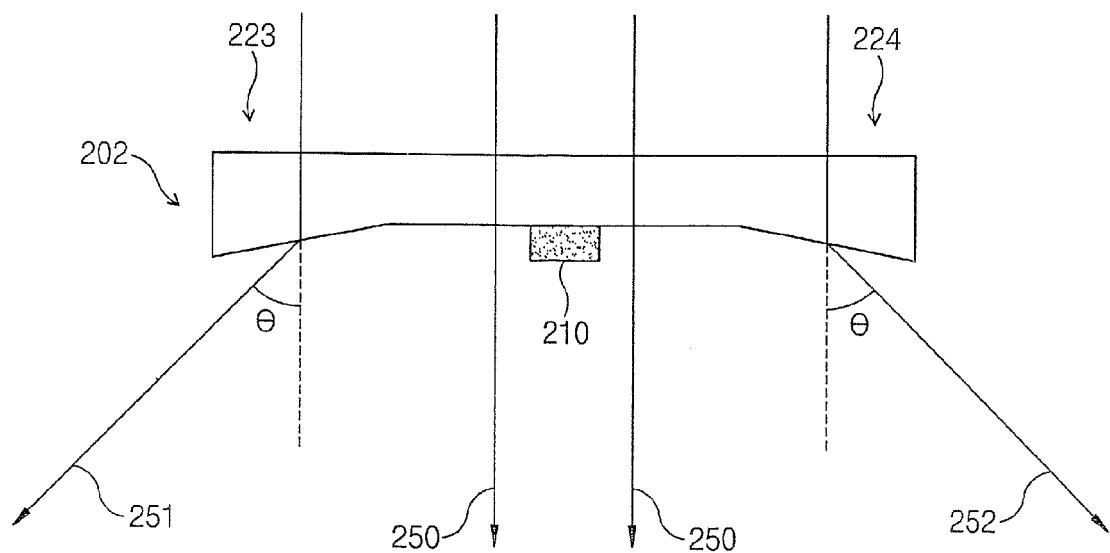
Figure 11C:
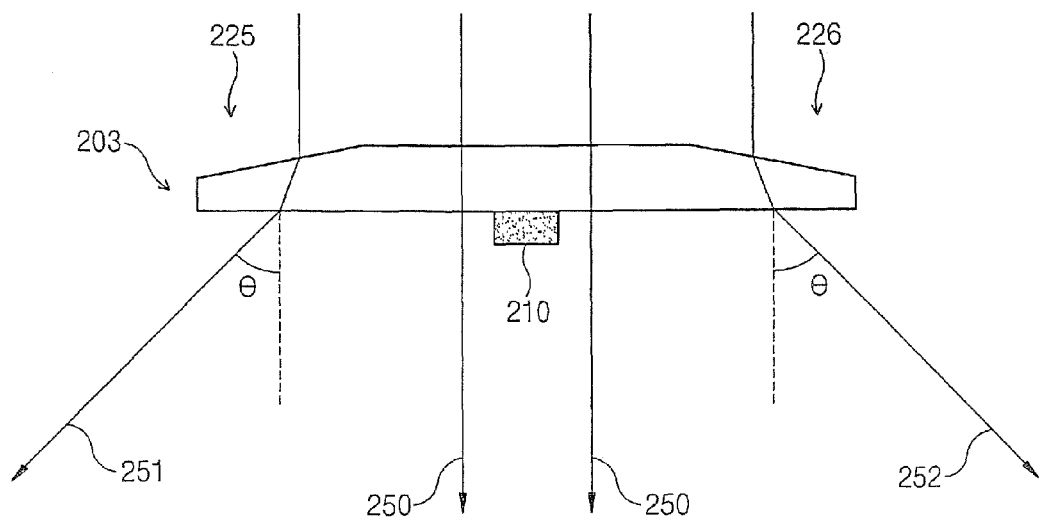

Referring to FIG. 10, an optical mask 204 according to fourth embodiments of the present invention includes a first reference pattern 211, a second reference pattern 212, a first comparative pattern 227, and a second comparative pattern 228, which are positioned at predetermined portions of a mask substrate 200. The first reference pattern 211 and the second reference pattern 212 are shading patterns spaced apart from each other. The first and second comparative patterns 227 and 228 are each refractive patterns arranged around the first and second reference patterns 211 and 212, respectively. For example, as illustrated in FIG. 10, the first and second comparative patterns 227 and 228 are each an echelon pattern that has a different thickness from the mask substrate 200. As described above, this thickness difference between the mask substrate 200 and the comparative patterns 227 and 228 refracts the beam paths passing through the comparative patterns 227 and 228. Accordingly, refraction angles of first and second comparative beams 251 and 252 can be changed by controlling the thickness difference between the mask substrate 200 and the comparative patterns 227 and 228.

The first and second reference patterns 211 and 212 and the first and second comparative patterns 227 and 228 are configured such that reference beams of the exposure beam passing through the first and second reference patterns 211 and 212 will travel in a direction parallel to each other, and comparative beams of the exposure beam passing through the first and second comparative patterns 227 and 228 will travel in a direction difference from each other. According to some embodiments, the first and second comparative patterns 227 and 228 are configured symmetrically about the first and second reference patterns 211 and 212.

Further, an overlay key may be formed such that the reference patterns 211 and 212 and the comparative patterns 227 and 228 can be measured using an overlay measuring apparatus. That is, photoresist patterns formed by the first and second reference patterns 211 and 212 are used as a reference mark for measuring position change of the photoresist patterns formed by the comparative patterns 227 and 228. According to a general or conventional exposure process, "the overlay" means a position change between photoresist patterns formed by a two-time lithography process that uses different mark patterns.

By contrast, according to some embodiments of the present invention, images formed by the first and second comparative patterns 227 and 228 are formed adjacent to images formed by the reference patterns 211 and 212. At this point, the images fowled by the reference beam 250 and the comparative beams 251 and 252 have different displacements depending on an angle of the exposure beam incident on the mask substrate 200. For example, even when the identical exposure beam is used, the displacement of the image formed by the comparative beams 251 and 252 is greater than the displacement of the image formed by the reference beam 250. According to some embodiments of the present invention, aberration of the exposure beam can be determined using a relationship between the incident angle of the exposure beam and the displacement of the image. Accordingly and in contrast to prior art overlay measuring methods, the aberration of the exposure beam can be determined using a one-time imaging process (Step 130 in FIG. 6).

Figure 13:
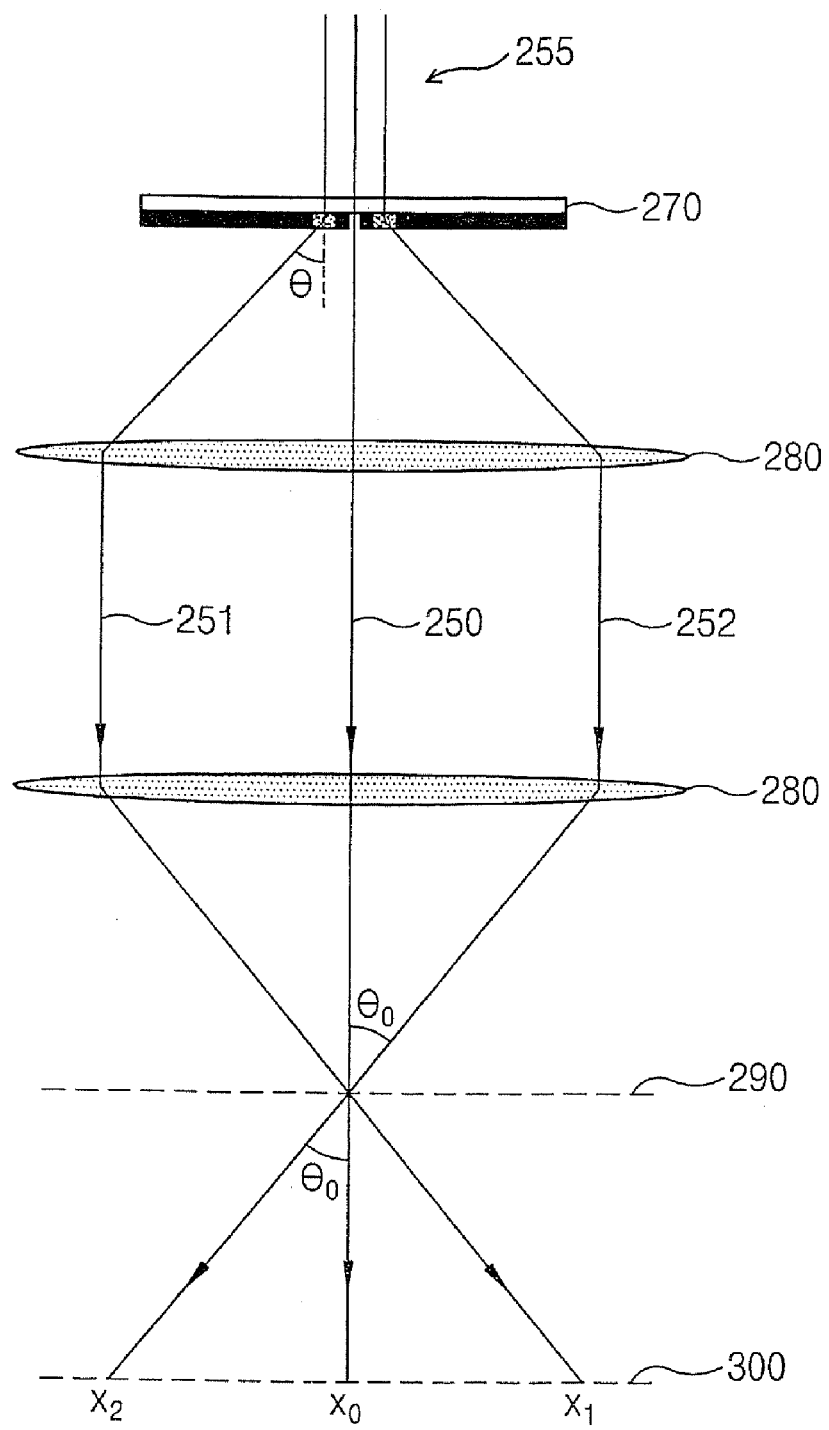
FIG. 13 is a schematic side view for explaining imaging according to embodiments of the present invention.

FIG. 13 is a view for explaining the imaging step of FIG. 6. The reference beam 250 and the first and second comparative beams 251 and 252 passing through the optical mask 270 (which may be, for example, one of the optical masks 201, 202 or 203) are directed onto a prescribed or predetermined image plane 300. A lens system 280 is arranged between the optical mask 270 and the image plane 300 such that the reference beam 250 and the first and second comparative beams 251 and 252 passing through the optical mask 270 are projected on a predetermined focus plane 290. The focus plane 290 is defined as the position of best focus as determined by the optical structure of the lens system 280.

In this embodiment, the imaging step (Step 130; FIG. 6) is performed under a defocus condition by arranging the image plane 300 at a defocus position, not the focus plane 290. Under the defocus condition, the reference beam 250 and the first and second comparative beams 251 and 252 form a reference image $x_0$ and comparative images $x_1$ and $x_2$ on the image plane 300. Here, the reference image $x_0$ and comparative images $x_1$ and $x_2$ are spaced apart from one another. As described above, the first and second comparative beams 251 and 252 are refracted at the optical mask 270 and thus form a predetermined inclination angle (θ) with respect to the reference beam 250. Because the lens system 280 changes the inclination angle (θ) of the first and second comparative beams 251 and 252, the first and second comparative beams 251 and 252 incident on the focus plane 290 and the image plane 300 form a prescribed or predetermined incident angle ($\theta_0$) inclined with respect to the reference beam 250. The incident angle ($\theta_0$) can be identical to the inclination angle (θ).

Figure 14:
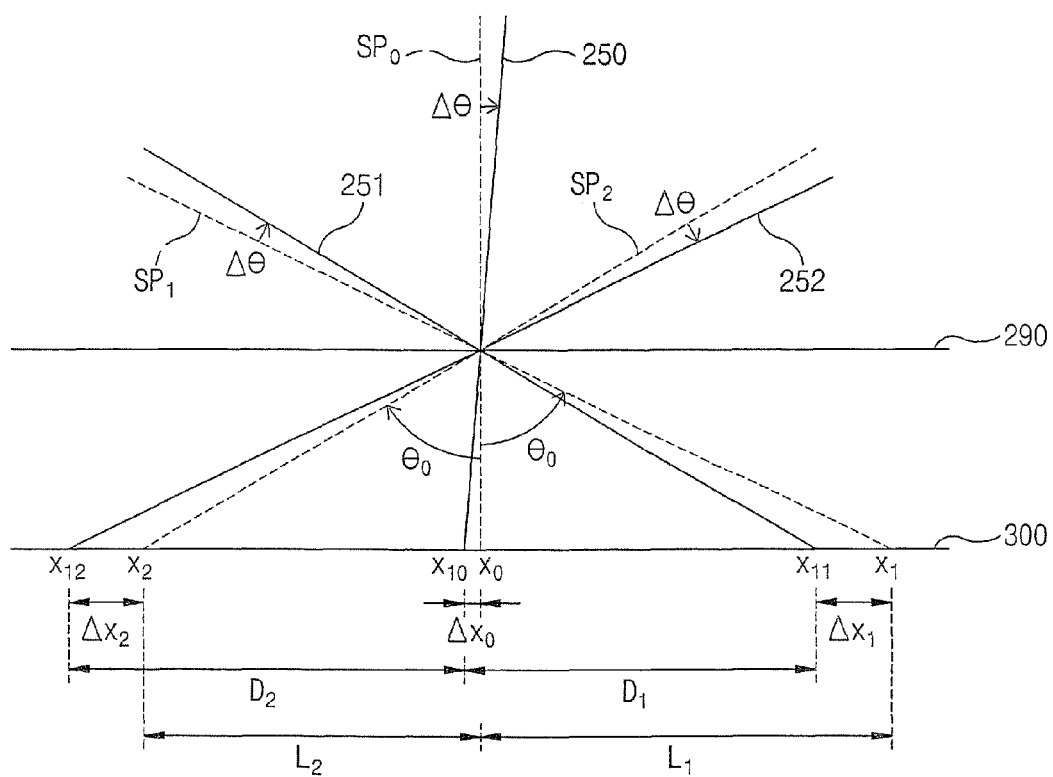
FIG. 14 is a schematic side view for explaining a relationship between an aberration angle of an exposure beam and displacements of images according to embodiments of the present invention.

FIG. 14 is a schematic view for explaining a relationship between an aberration angle (Δθ) of an exposure beam and a displacement of images ($x_0$, $x_1$ and $x_2$) according to embodiments of the present invention. With reference also to FIG. 13, when the exposure beam 255 is incident on the optical mask 270 in such a state that it is deviated from the standard path by a predetermined aberration angle Δθ, the reference beam 250 and the first and second comparative beams 251 and 252 are also deviated from the standard path by the aberration angle Δθ. The "standard path" means a path through which the exposure beam travels in the exposure system having the perfect telecentricity. Reference numerals $SP_0$, $SP_1$ and $SP_2$ represent standard paths of the reference beam 250, the first comparative beam 251 and the second comparative beam 252, respectively. In general, the standard path of the exposure beam is vertically incident on the optical mask 270. However, when an off-axis illumination is applied, the exposure beam may have an actual path where a beam is obliquely incident on the optical mask 270. Consequently, the "aberration angle Δθ" means a difference of angle formed by an exposure beam used in an actual exposure process with respect to a standard path of an exposure beam required in an ideal exposure process.

When the aberration angle does not disappear (that is, Δθ≠0), a reference image $x_{10}$, a first comparative image $x_{11}$ and a second comparative image $x_{12}$ formed on the image plane 300 are spaced apart from the reference image $x_0$, the first comparative image $x_1$ and the second comparative image $x_2$, which are formed on the image plane 300 when they follow the standard path (that is, Δθ=0). Those displacements $\Delta x_0$, $\Delta x_1$ and $\Delta x_2$ of the reference image, the first comparative image and the second comparative image are expressed as Equations 2 to 4 below.

$$\Delta x_0 = x_0 - x_{10} \quad \text{(Equation 2)}$$

$$\Delta x_1 = x_1 - x_{11} \quad \text{(Equation 3)}$$

$$\Delta x_2 = x_2 - x_{12} \quad \text{(Equation 4)}$$

In the actual measurement, the images $x_0$, $x_1$ and $x_2$ having the aberration angle of zero are not observed. Accordingly, the displacements $\Delta x_0$, $\Delta x_1$ $\Delta x_2$ cannot be measured in practice. As shown in FIG. 14, however, the first and second comparative beams 251 and 252 are incident on the focus plane 290 and the imaging plane 300 at an inclined angle. Thus, the displacements $\Delta x_1$ and $\Delta x_2$ of the comparative beams 251 and 252 are greater than the displacement $\Delta x_0$ of the reference beam 250. Using Equations 2 to 4, those differences between the displacements can be expressed as Equations 5 and 6 below.

$$\Delta x_1 - \Delta x_0 = x_1 - x_{11} - x_0 + x_{10} = x_{10} - x_{11} + L_0, \quad L_1 \equiv x_1 - x_0 \quad \text{(Equation 5)}$$

$$\Delta x_0 - \Delta x_2 = x_0 - x_{10} - x_2 + x_{12} = x_{12} - x_{10} + L_0, \quad L_2 \equiv x_1 - x_0 \quad \text{(Equation 6)}$$

In Equations 5 and 6, positions of the reference image $x_{10}$, the first comparative image $x_{11}$ and the second comparative image $x_{12}$ are measurable values. When a difference (Z) between the focus plane 290 and the image plane 300 and an incident angle ($\theta_0$) of the first and second comparative beams 251 and 252 are known, magnitudes of the lengths $L_1$ and $L_2$ can be expressed as Equation 7 below.

$$L_1 = L_2 = Z \tan \theta_0 \quad \text{(Equation 7)}$$

In this embodiment, however, the first and second comparative beams 251 and 252 have a symmetrical path with respect to the reference beam 250. Thus, the relationship between the displacements $\Delta x_0$, $\Delta x_1$ and $\Delta x_2$ and the aberration angle Δθ can be expressed independently of the lengths $L_1$ and $L_2$. That is, using Equations 5 to 7, the relationship can be expressed as Equation 8 below, which is independent of the lengths $L_1$ and $L_2$.

$$(\Delta x_1 - \Delta x_0) - (\Delta x_0 - \Delta x_2) = x_{10} - x_{11} - x_{12} + x_{10} \quad \text{(Equation 8)}$$

Meanwhile, as illustrated in FIG. 14, the displacements $\Delta x_0$, $\Delta x_1$ and $\Delta x_2$ have a geometrical relationship expressed as Equations 9 to 11 below.

$$\Delta x_0 = Z \tan \Delta \theta \quad \text{(Equation 9)}$$

$$\Delta x_1 = Z \tan \theta_0 - Z \tan(\theta_0 - \Delta \theta) \quad \text{(Equation 10)}$$
$$= Z \tan \theta_0 - Z \left[ \frac{\tan \theta_0 - \tan \Delta \theta}{1 + \tan \theta_0 \tan \Delta \theta} \right]$$

$$\Delta x_2 = Z \tan(\theta_0 + \Delta \theta) - Z \tan \theta_0 \quad \text{(Equation 11)}$$
$$= Z \left[ \frac{\tan \theta_0 + \tan \Delta \theta}{1 - \tan \theta_0 \tan \Delta \theta} \right] - Z \tan \theta_0$$

Using Equations 9 to 11, the left side of Equation 8 can be rewritten as Equation 12 below.

$$(\Delta x_1 - \Delta x_0) - (\Delta x_0 - \Delta x_2) = \quad \text{(Equation 12)}$$
$$2 Z \tan \Delta \theta \left[ -\frac{1}{\cos^2 \theta_0} \frac{1}{1 - \tan^2 \theta_0 \tan^2 \Delta \theta} \right]$$

When the aberration angle Δθ is very small, the term of tan Δθ can be approximated to Δθ (tan Δθ~Δθ, for Δθ<<1). According to the present invention, since the aberration angle Δθ of the exposure beam is small enough to satisfy the approximate expression, Equation 12 can be rewritten as Equation 13 below.

$$(\Delta x_1 - \Delta x_0) - (\Delta x_0 - \Delta x_2) = 2 Z \Delta \theta \left[ 1 - \frac{1}{\cos^2 \theta_0} \right] \quad \text{(Equation 13)}$$

Combining Equations 8 and 13, the quantitative relationship between the aberration angle Δθ of the exposure beam and the positions of the images can be obtained as Equations 14 and 15 below.

$$x_{10} - x_{11} - x_{12} + x_{10} = 2 Z \Delta \theta \left[ 1 - \frac{1}{\cos^2 \theta_0} \right] \quad \text{(Equation 14)}$$

$$\Delta \theta = \frac{1}{2} \frac{x_{10} - x_{11} - x_{12} + x_{10}}{Z} \left[ 1 - \frac{1}{\cos^2 \theta_0} \right]^{-1} \quad \text{(Equation 15)}$$
$$= \frac{1}{2} \frac{D_1 - D_2}{Z} \left[ 1 - \frac{1}{\cos^2 \theta_0} \right]^{-1}$$

where, $D_1 = x_{10} - x_{11}$ and $D_2 = x_{12} - x_{10}$

Using Equation 15, the aberration angle $\Delta\theta$ of the exposure beam can be determined by measuring the distances $D_1$ and $D_2$ between the reference image $x_0$ and the comparative images $x_{11}$ and $x_{12}$, which are measured on the image plane 300 (Step 140 in FIG. 6). At this point, the standard incident angle $\theta_0$ of the comparative beams 251 and 252 is one of structural variables determined in such a state that the exposure system including the lens system 280 is optimized. Also, the distance Z between the focus plane 290 and the actual image plane 300 is one of process variables that can be arbitrarily adjusted in the aberration measuring step. Those structural variables or process variables of the system can be precisely determined through measurement or calculation.

According to further embodiments of the present invention, the optical mask 270 may include one reference pattern and one comparative pattern. In this case, using Equations 5, 9 and 10, the relationship between the aberration angle $\Delta\theta$ of the exposure beam and the positions of the images can be obtained as Equations 16 and 17.

$$\Delta x_1 - \Delta x_0 = x_{10} - x_{11} + L_0 = Z\Delta\theta\left[1 - \frac{1}{\cos^2\theta_0}\right] \quad \text{(Equation 16)}$$

$$\Delta\theta = \frac{x_{10} - x_{11} + L_0}{Z}\left[1 - \frac{1}{\cos^2\theta_0}\right]^{-1} \quad \text{(Equation 17)}$$
$$= \frac{D + L_0}{Z}\left[1 - \frac{1}{\cos^2\theta_0}\right]$$

where $D_1 = x_{10} - x_{11}$

As discussed above, according to some embodiments of the present invention, an optical mask having a reference pattern and a comparative pattern is provided. The reference pattern is used for imaging a reference beam and the comparative pattern is used for imaging a comparative beam for comparison with the reference beam. The comparative beam does not travel in parallel to the reference beam. Rather, the comparative pattern is a refractive pattern that refracts the exposure beam. For example, the comparative pattern may be at least one pattern selected from the group consisting of a prismatic pattern, an echelon pattern, an echelon grating, and a transmission grating.

Further, the imaging process may be performed under a defocused condition. According to this defocused imaging process, when the aberration angle $\Delta\theta$ is not zero, the displacements of the images formed by the comparative beam and the reference beam are changed. Accordingly, as expressed as Equation 18 below, the aberration angle $\Delta\theta$ can be expressed as a function of the positions of the images formed by the reference beam and the comparative beam, which are incident at different angles, the structural variables (S) including the standard incident angle ($\theta_0$) of the comparative beam, and the process variables (P) including the defocused condition.

$$\Delta\theta = f(x_0, x_{10}, x_1, x_{11}, x_2, x_{12}, S, P) \quad \text{(Equation 18)}$$

Consequently, if the right-side variables of Equation 18 are determined through calculation or measurement, the aberration angle $\Delta\theta$ of the exposure beam can be determined. If the detected aberration angle $\Delta\theta$ is not null, the step of correcting the aberration angle may be included after the step of determining the aberration angle (Step 140 of FIG. 6).

According to embodiments of the present invention, an optical mask for use with an exposure beam includes a reference pattern for a reference beam of the exposure beam and a comparative pattern for a comparative beam of the exposure beam inclined with respect to the reference beam. When the exposure beam is incident on the optical mask at a non-zero aberration angle, the relative displacements or deviations of the respective images formed by the reference beam and the comparative beam are different due to the inclination angle between the reference beam and the comparative beam.

According to the inventive method for measuring the aberration of a beam, the aberration of the exposure beam can be determined through the measurement of the displacements of the images by using the relationship between the aberration angle and the displacements of images. Since the displacements of the images are measured through a one-time imaging process, the aberration angle of the exposure beam can be precisely measured without being influenced by mechanical errors of the system, which may be caused by mechanical position movements.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

What is claimed is:

1. An optical mask for use with an exposure beam, the optical mask comprising:
   a mask substrate adapted to be placed on a traveling path of the exposure beam;
   a reference pattern formed on the mask substrate, the reference pattern being adapted to direct the exposure beam to travel in a predetermined reference direction; and
   a comparative pattern formed on the mask substrate, the comparative pattern being adapted to direct the exposure beam to travel in a direction inclined at a predetermined angle with respect to the reference direction.

2. The optical mask of claim 1 wherein the reference pattern includes at least one pattern selected from the group consisting of a shading pattern, a chrome pattern, an attenuated pattern, and a phase shift pattern.

3. The optical mask of claim 1 wherein the comparative pattern includes a first comparative pattern and a second comparative pattern, which are respectively located on either side of the reference pattern.

4. The optical mask of claim 3 wherein the first comparative pattern and the second comparative pattern are spaced apart from the reference pattern by an equal distance.

5. The optical mask of claim 3 wherein the first comparative pattern is adapted to direct a first comparative beam passing through the first comparative pattern to travel in a direction defined by a zenith angle of $\theta$ and an azimuthal angle of $\phi$ with respect to the reference direction, and the second comparative pattern is adapted to direct a second comparative beam passing through the second comparative pattern to travel in a direction defined by a zenith angle of $\theta$ and an azimuthal angle of $\phi + \pi$.

6. The optical mask of claim 3 wherein the first and second comparative patterns have a plane-symmetrical configuration centered on the reference pattern, such that exposure beams passing through the first and second comparative patterns have plane-symmetrical traveling paths with respect to the reference direction.

7. The optical mask of claim 3 wherein each of the first and second comparative patterns includes at least one pattern selected from the group consisting of a prismatic pattern, an echelon pattern, an echelon grating, and a transmission grating.

8. An optical mask for use with an exposure beam, the optical mask comprising:
- a mask substrate adapted to be placed on a traveling path of the exposure beam;
- first and second reference patterns formed on the mask substrate, the first and second reference patterns being adapted to direct the exposure beam to travel in a predetermined reference direction; and
- first and second comparative patterns formed on the mask substrate and spaced apart from the first and second reference patterns, respectively;
- wherein the first and second comparative patterns have a symmetrical configuration centered about the first and second reference patterns, respectively, such that first and second comparative beams of the exposure beam passing through the first and second comparative patterns, respectively, have symmetrical traveling paths with respect to the reference direction.

9. The optical mask of claim 8 wherein the first comparative pattern is adapted to direct the first comparative beam passing through the first comparative pattern to travel in a direction defined by a zenith angle of $\theta$ and an azimuthal angle of $\phi$ with respect to the reference direction, and the second comparative pattern is adapted to direct the second comparative beam passing through the second comparative pattern to travel in a direction defined by a zenith angle of $\theta$ and an azimuthal angle of $\phi+\pi$.

10. The optical mask of claim 8 wherein each of the first and second reference patterns includes at least one pattern selected from the group consisting of a shading pattern, a chrome pattern, an attenuated patter, and a phase shift pattern.

11. The optical mask of claim 8 wherein each of the first and second comparative patterns includes at least one pattern selected from the group consisting of a prismatic pattern, an echelon pattern, an echelon grating, and a transmission grating.

* * * * *